(12) United States Patent
Lin et al.

(10) Patent No.: US 9,029,203 B2
(45) Date of Patent: May 12, 2015

(54) METHOD OF FABRICATING SEMICONDUCTOR PACKAGE

(71) Applicant: Siliconware Precision Industries Co., Ltd., Taichung (TW)

(72) Inventors: Pang-Chun Lin, Taichung (TW); Yueh-Ying Tsai, Taichung (TW); Yong-Liang Chen, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 98 days.

(21) Appl. No.: 13/971,136

(22) Filed: Aug. 20, 2013

(65) Prior Publication Data

US 2013/0344661 A1   Dec. 26, 2013

Related U.S. Application Data

(62) Division of application No. 13/349,049, filed on Jan. 12, 2012, now Pat. No. 8,525,336.

(30) Foreign Application Priority Data

Oct. 17, 2011   (TW) .............................. 100137485 A

(51) Int. Cl.
| | | |
|---|---|---|
| *H01L 21/44* | (2006.01) | |
| *H01L 21/48* | (2006.01) | |
| *H01L 23/31* | (2006.01) | |
| *H01L 23/498* | (2006.01) | |
| *H01L 23/00* | (2006.01) | |

(52) U.S. Cl.
CPC ........ *H01L 21/4846* (2013.01); *H01L 23/3114* (2013.01); *H01L 23/49816* (2013.01); *H01L 23/49861* (2013.01); *H01L 24/16* (2013.01); *H01L 2224/131* (2013.01); *H01L 2224/16238* (2013.01)

(58) Field of Classification Search
CPC ............................ H01L 21/4846; H01L 21/48
USPC .................................... 438/124, 613; 257/738
See application file for complete search history.

(56) References Cited

U.S. PATENT DOCUMENTS

| | | | |
|---|---|---|---|
| 6,157,084 A * | 12/2000 | Hino et al. ..................... | 257/773 |
| 6,497,943 B1 | 12/2002 | Jimarez et al. | |
| 7,071,571 B2 | 7/2006 | Dangelmaier et al. | |
| 7,414,317 B2 * | 8/2008 | Lee et al. ....................... | 257/775 |
| 7,795,071 B2 | 9/2010 | Hwee-Seng et al. | |
| 7,880,295 B2 | 2/2011 | Kikuchi et al. | |

* cited by examiner

*Primary Examiner* — Theresa T Doan

(74) *Attorney, Agent, or Firm* — Mintz Levin Cohn Ferris Glovsky and Popeo, P.C.; Peter F. Corless; Steven M. Jensen

(57) ABSTRACT

This disclosure provides a semiconductor package and a method of fabricating the same. The semiconductor package includes an insulating layer; a plurality of traces and connection pads disposed in the insulating layer and protruded from the insulating layer; a plurality of bumps formed on the plurality of traces; a semiconductor chip disposed on the bumps; and an encapsulant formed on the insulating layer to encapsulate the semiconductor chip, the plurality of bumps, traces and connection pads. When the encapsulant is formed, voids can be prevented from being generated in the traces and the connection pads and thus the yield of process is significantly increased.

6 Claims, 4 Drawing Sheets

METHOD OF FABRICATING SEMICONDUCTOR PACKAGE

CROSS-REFERENCE TO RELATED APPLICATIONS

This application is a divisional of application U.S. Ser. No. 13/349,049, filed on Jan. 12, 2012, issued as U.S. Pat. No. 8,525,336 on Sep. 3, 2013, which claims under 35 U.S.C. §119(a) the benefit of Taiwanese Application No. 100137485, filed on Oct. 17, 2011, the entire contents of which are incorporated herein by reference.

TECHNICAL FIELD

The disclosure relates generally to semiconductor packages and methods of fabricating the same, and more particularly, to a quad flat non-leaded semiconductor package and a method of fabricating the same.

BACKGROUND

The quad flat non-leaded package is a semiconductor package unit that the bottom of the die pad and the leads are exposed from the bottom surface of a package encapsulant. The surface-mounting technique is generally used for mounting the semiconductor package on a printed circuit board, so as to form a circuit module with a specific function.

Referring to FIG. 2, U.S. Pat. No. 7,795,071 discloses a quad flat non-leaded package. The quad flat non-leaded package has an insulating layer 25, and a plurality of traces 26 and connection pads 27 embedded in the insulating layer 25. The traces 26 and the connection pads 27 are exposed from the insulating layer 25 and co-planar therewith. A semiconductor chip 28 is disposed on the traces 26; and a package encapsulant 29 is formed on the insulating layer 25 so as to encapsulate the semiconductor chip 28. As the traces 26 are formed between the two connection pads 27, and the semiconductor chip 28 is attached to the traces 26 through the bumps 30, there exists a problem of insufficient bonding strength between the bumps 30 and the traces 26 resulting from the co-planarity of the traces 26 and the insulating layer 25. In addition, the spacing for flowing the package encapsulant 29 between any two adjacent traces 26 is merely contributed by the height of the bumps 30. As such, since the package encapsulant 29 is not easy to flow into the spacing, it is easily to generate voids 31, resulting in popcorn concern and low yield.

Therefore, how to provide a semiconductor package and a method of fabricating the same to solve the problems and to improve the yield has been becoming one of the critical issues in the art.

SUMMARY

In view of the above drawbacks of the prior art, the disclosure provides a semiconductor package comprising: an insulating layer having a top surface and a bottom surface; a plurality of traces and connection pads formed in the insulating layer and protruded from the top surface of the insulating layer, and the connection pads are exposed from the bottom surface of the insulating layer; a plurality of bumps formed on the traces; a semiconductor chip disposed on the bumps; and an encapsulant formed on the insulating layer to encapsulate the semiconductor chip, the bumps, the traces and the connection pads.

The disclosure further provides a method of fabricating a semiconductor package comprising: formed on a substrate a metal layer with patterned trenches; forming a plurality of traces and connection pads in the patterned trenches, allowing a thickness of each of the traces and the connection pads being greater than a depth of each of the patterned trenches; forming an insulating layer on the bottom surface of the metal layer for encapsulating the traces and the connection pads with the bottom surface of the connection pads being exposed from the insulating layer; removing a portion of the substrate and the metal layer, so as for the traces and the connection pads to be exposed and protruded from the insulating layer; attaching a semiconductor chip to the traces by the bumps; and forming an encapsulant on the insulating layer for encapsulating the semiconductor chip, the bumps, the traces and the connection pads. From the foregoing, the traces and the connection pads are protruded from the top surface of the insulating layer according to the disclosure, such that the bumps are allowed to encapsulate the traces and the connection pads, so as to improve the bonding strength. In addition, since the traces and the connection pads are protruded from the top surface of the insulating layer, the spacing between the semiconductor chip and the insulating layer is increased, allowing the encapsulating material that forms the encapsulant to easily flow between the traces and between the traces and connection pads. As a result, the voids can be prevented from occurrence and the product yield is significantly improved.

DETAILED DESCRIPTION OF PREFERRED EMBODIMENTS

The following illustrative embodiments are provided to illustrate the disclosure, and these and other advantages and effects can be apparently understood by those in the art after reading the disclosure. The disclosure can also be performed or applied by other different embodiments. The details of the specification may be carried out based on different points and applications, and numerous modifications and variations can be devised without departing from the spirit of the disclosure.

Furthermore, the drawings accompanied with the disclosure of the instructions are simplified schematic diagram, and only indicate the basic technical idea of the disclosure, such that the actual implementation of each component type, quantity and proportion of visual implementation of the requirements may vary.

Referring to FIGS. 1A to 1K, cross-sectional views illustrating a method of fabricating a semiconductor package according to the disclosure are shown.

Figure 1A:
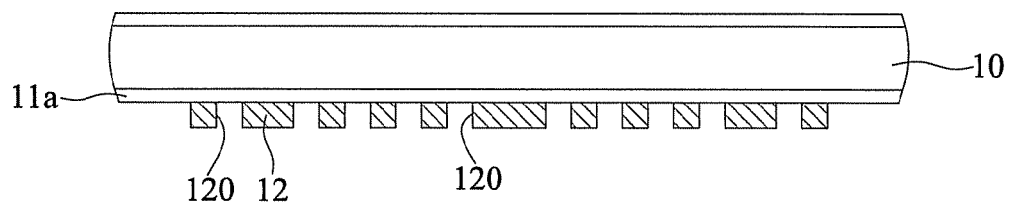
FIGS. 1A to 1K are cross-sectional views illustrating a method of fabricating a semiconductor package according to the invention, wherein FIG. 1K' shows another embodiment of attaching the semiconductor chip to the bumps.
Figure 1B:
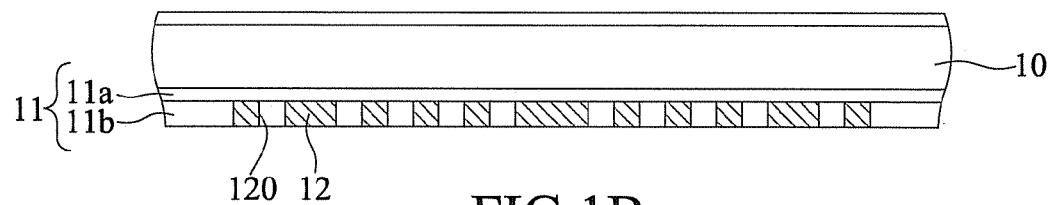
Figure 1C:
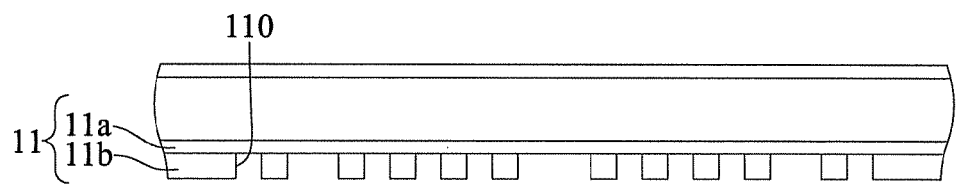

As shown in FIGS. 1A to 1C, a substrate 10 having a metal layer 11 on a surface thereof is provided. The metal layer 11 has patterned trenches 110, and the substrate 10 may be made of iron, for example. The metal layer 11 may be made of copper, for example, but not limited thereto.

As an embodiment, the formation of the patterned trenches 110 includes, as shown in FIG. 1A, forming a first photo resist layer 12 on a metal film 11a formed on the substrate 10, and the first photo resist layer 12 has a plurality of first openings 120 to expose a portion of the metal film 11a. As shown in FIG. 1B, a metal material 11*b* is formed in the first openings 120, allowing the metal layer 11 to be formed by the metal film 11*a* and the metal material 11*b*. Further, the first photo resist layer 12 is removed to form the patterned trenches 110 defined by the metal material 11*b* and the metal film 11*a*, as shown in FIG. 1C.

As shown in FIG. 1D to 1G, a plurality of traces and connection pads are formed in the patterned trenches 110, and the thickness of each of the plurality traces and connection pads is greater than the depth of each of the patterned trenches.

Figure 1D:
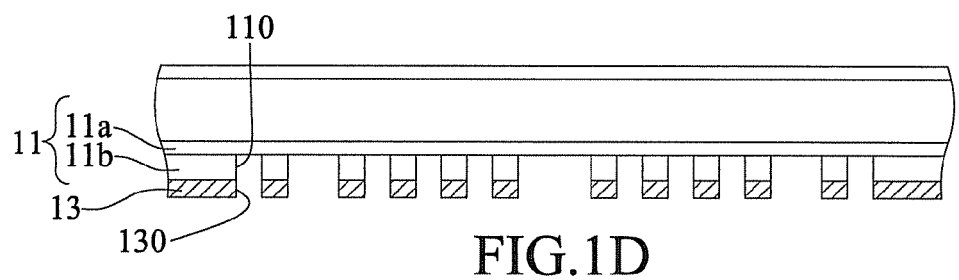

For example, as shown in FIG. 1D, a second photo resist layer 13 is formed on the metal layer 11 (the metal material 11*b*), and the second photo resist layer 13 has a plurality of second openings 130 corresponding in position to the patterned trenches 110 for exposing the patterned trenches 110 to be exposed from the second photo resist layer 13.

Figure 1E:
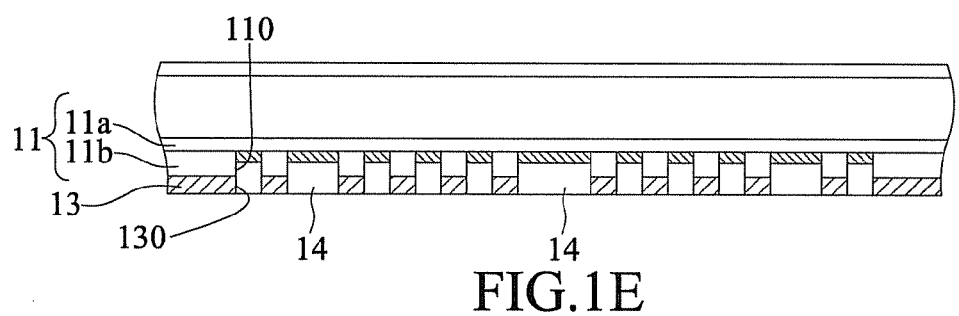

As shown in FIG. 1E, a first patterned metal layer 14 is formed in the patterned trenches 110 and the second openings 130. The material of the first patterned metal layer 14 may be nickel/copper, but not limited thereto.

Figure 1F:
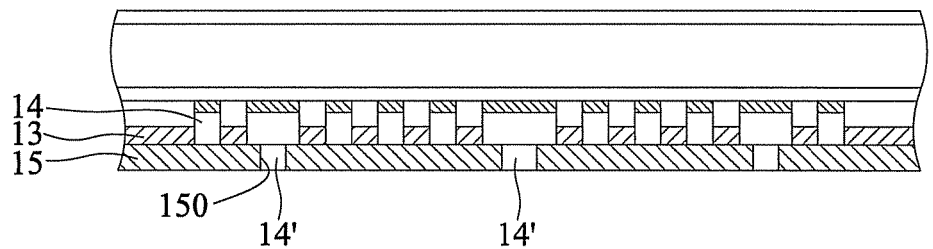

As shown in FIG. 1F, a third photo resist layer 15 is formed on the second photo resist layer 13 and the first patterned metal layer 14, and the third photo resist layer 15 has a plurality of third openings 150 for exposing a portion of the first patterned metal layer 14; and then, a second patterned metal layer 14' is formed in the third openings 150.

Figure 1G:
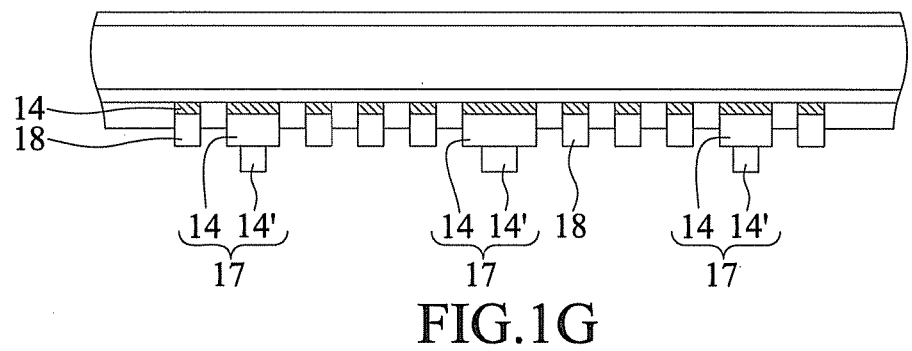

As shown in FIG. 1G, the second photo resist layer 13 and the third photo resist layer 15 are removed to form the connection pads 17 from a section connecting the second patterned metal layer 14' and the first patterned metal layer 14, and to form the traces 18 from the first patterned metal layer 14 exclusive of the connecting section. Also, as an embodiment, the plurality of traces 18 and connection pads 17 are made of nickel/copper.

Figure 1H:
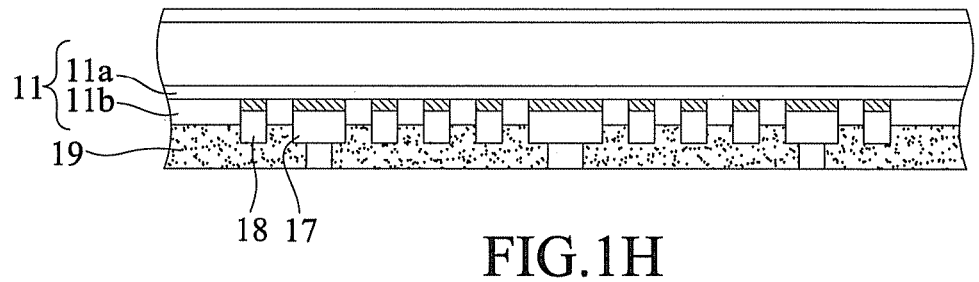

As shown in FIG. 1H, an insulating layer 19 encapsulating the plurality of traces 18 and connection pads 17 is formed on the metal layer 11, allowing the bottom surfaces of the plurality of connection pads 17 to be exposed therefrom. As an embodiment, the insulating layer 19 completely covers the traces 18 and the connection pads 17 when the insulating layer 19 is formed. Then, a portion of the insulating layer 19 is removed by grinding to expose the plurality of connection pads 17.

Figure 1I:
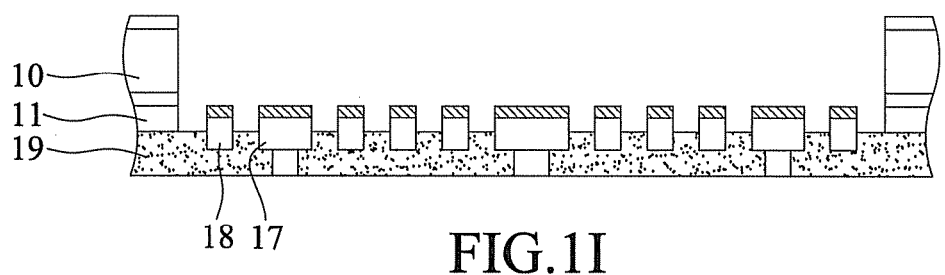

As shown in FIG. 1I, at least a portion of the substrate 10 and a portion of the metal layer 11 are removed by etching, to thereby expose the traces 18 and the connection pads 17 from the insulating layer 19, and to allow the traces 18 and the connection pads 17 to be protruded from the insulating layer 19.

Figure 1J:
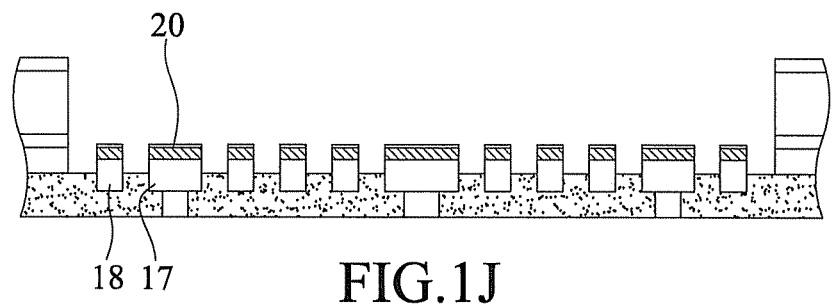

As shown in FIG. 1J, a metal-plated layer 20 is formed on the plurality of traces 18 and connection pads 17 prior to the attachment of the semiconductor chip. As an embodiment, the metal-plated layer 20 is made of nickel/palladium/gold.

Figure 1K:
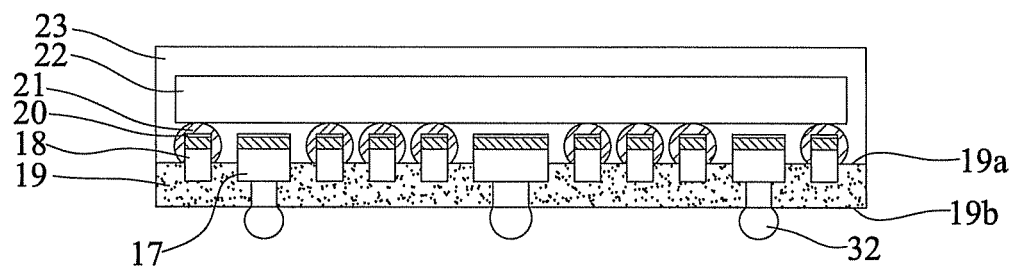
Figure 1K:
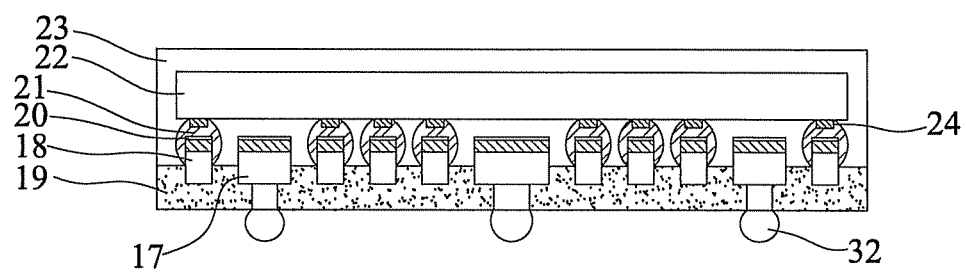
Figure 2:
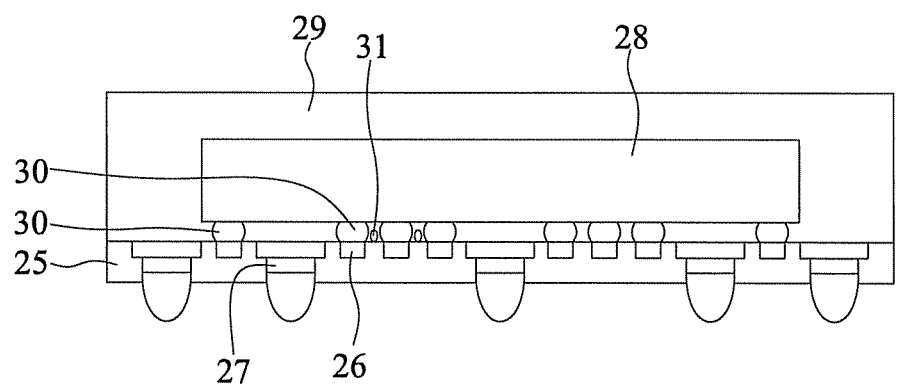
FIG. 2 is a cross-sectional view illustrating a semiconductor package according to the prior art.

As shown in FIG. 1K, a semiconductor chip 22 is disposed on the traces 18 by bumps 21 made of a solder material; and an encapsulant 23 is formed on the insulating layer 19 for encapsulating the semiconductor chip 22, the bumps 21, the traces 18 and the connection pads 17. Solder balls 32 are then implanted on the connection pads 17 exposed from the bottom surface 19*b* of the insulating layer 19.

Also, as another embodiment, FIG. 1K shows the step of attaching the semiconductor chip 22 to the bumps 21. Metal pillars 24 corresponding in position to the bumps 21 are formed on the semiconductor chip 22, so as for the bumps 21 encapsulate the metal pillars 24 upon attaching the semiconductor chip 22 to the traces 18.

Accordingly, the semiconductor package as shown in FIG. 1K is formed. The semiconductor package of the disclosure includes: the insulating layer 19; the plurality of traces 18 and connection pads 17 formed in the insulating layer 19 and protruded from the top surface 19*a* of the insulating layer 19, in which the plurality of connection pads 17 are further exposed from the bottom surface 19*b* of the insulating layer 19; the plurality of bumps 21 formed on the plurality of traces 18; the semiconductor chip 22 disposed on the bumps 21; the encapsulant 23 formed on the insulating layer 19 to encapsulate the semiconductor chip 22, the bumps 21, the traces 18 and the connection pads 17.

In the aforementioned semiconductor package, as an embodiment, further includes the metal-plated layer 20 formed on the plurality of traces 18, and the bumps 21 are formed on the metal-plated layer 20. Also, the metal pillars 24 corresponding in position to the bumps 21 are formed on the semiconductor chip 22, and the bumps 21 encapsulate the metal pillars 24.

Also, as another embodiment, the aforementioned semiconductor package further includes the solder balls 32 implanted on the connection pads 17 exposed from the bottom surface 19*b* of the insulating layer 19.

In summary, since the traces and the connection pads are protruded from the top surface of the insulating layer according to the disclosure, the bumps are allowed to encapsulate the traces and the connection pads, to thereby improve the bonding strength. In addition, since the traces and the connection pads are protruded from the top surface of the insulating layer, the spacing between the semiconductor chip and the insulating layer is increased, an encapsulating material molding compound for forming the encapsulant can easily flow through the gap between the traces and that between the traces and the connection pads. As a result, the voids can be efficiently prevented from occurrence and the product yield can be significantly improved.

While the disclosure has been described in terms of what are presently considered to be the most practical and preferred embodiments, it is to be understood that the disclosure need not limit to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method of fabricating a semiconductor package, comprising:

forming on a substrate a metal layer with patterned trenches;

forming a plurality of traces and connection pads in the patterned trenches, wherein a thickness of each of the traces and connection pads is greater than a depth of each of the patterned trenches;

forming an insulating layer for encapsulating the traces and connection pads on the metal layer in a manner that bottom surfaces of the connection pads are exposed from the insulating layer;

removing a portion of the substrate and the metal layer, so as for the traces and connection pads to be exposed and protruded from the insulating layer;

attaching a semiconductor chip to the traces by a plurality of bumps; and forming an encapsulant on the insulating layer for encapsulating the semiconductor chip, the bumps, the traces and the connection pads.

2. The method of claim 1, wherein the formation of the patterned trenches comprises:

forming a first photo resist layer on the substrate having a metal film formed thereon, followed by forming a plurality of first openings in the first photo resist layer to expose a portion of the metal film;

forming a metal material in the first openings; and removing the first photo resist layer so as to form the patterned trenches in the metal layer which is constituted by the metal material and the metal film.

3. The method of claim 1, wherein the formation of the traces and the connection pads comprises:

forming a second photo resist layer on the metal layer, and forming a plurality of second openings in the second photo resist layer having second openings corresponding in position to and to expose the patterned trenches;

forming a first patterned metal layer in the patterned trenches and the second openings;

forming a third photo resist layer on the second photo resist layer and the first patterned metal layer, and forming a plurality of third openings in the third photo resist layer to expose a portion of the first patterned metal layer;

forming a second patterned metal layer in the third openings; and removing the second photo resist layer and the third photo resist layer to form the connection pads from a section connecting the second patterned metal layer and the first patterned metal layer and to form the traces from the first patterned metal layer exclusive of the section.

4. The method of claim 1, further comprising forming a metal-plated layer on the traces, prior to attaching the semiconductor chip, so as to attach the semiconductor chip by the bumps disposed on the metal-plated layer.

5. The method of claim 1, wherein on the semiconductor chip metal pillars corresponding in position to the bumps are formed, such that the metal pillars are encapsulated by the bumps after the attachment of the semiconductor chip.

6. The method of claim 1, further comprising forming solder balls on the connection pads exposed from the insulating layer.

* * * * *